(12) United States Patent
Choi

(10) Patent No.: US 9,343,510 B2
(45) Date of Patent: May 17, 2016

(54) ORGANIC LIGHT EMITTING DISPLAY DEVICE

(71) Applicant: LG DISPLAY CO., LTD., Seoul (KR)

(72) Inventor: Sung Hoon Choi, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/552,224

(22) Filed: Nov. 24, 2014

(65) Prior Publication Data

US 2015/0187847 A1 Jul. 2, 2015

(30) Foreign Application Priority Data

Dec. 27, 2013 (KR) ........................ 10-2013-0165283

(51) Int. Cl.
*H01L 27/32* (2006.01)
*H01L 51/52* (2006.01)

(52) U.S. Cl.
CPC ........ *H01L 27/3211* (2013.01); *H01L 51/5275* (2013.01)

(58) Field of Classification Search
None
See application file for complete search history.

(56) References Cited

U.S. PATENT DOCUMENTS

| 2006/0011933 A1* | 1/2006 | Riess ................. H01L 51/5268 257/98 |
| 2010/0001301 A1* | 1/2010 | Karg et al. ...................... 257/98 |
| 2011/0095675 A1* | 4/2011 | Oda ..................... H01L 51/5265 313/499 |

* cited by examiner

*Primary Examiner* — Charles Garber
*Assistant Examiner* — Alia Sabur
(74) *Attorney, Agent, or Firm* — Birch, Stewart, Kolasch & Birch, LLP

(57) ABSTRACT

An OLED device according to one example includes a substrate defined into a plurality of sub-pixel regions which includes red, green and blue sub-pixel regions; a first electrode formed on the substrate; an organic emission layer formed on the first electrode; a second electrode formed on the organic emission layer; and a capping layer formed on the second electrode. The capping layer is formed to contain an optical adjustment material which rises in proportion to a wavelength of incident light.

14 Claims, 3 Drawing Sheets

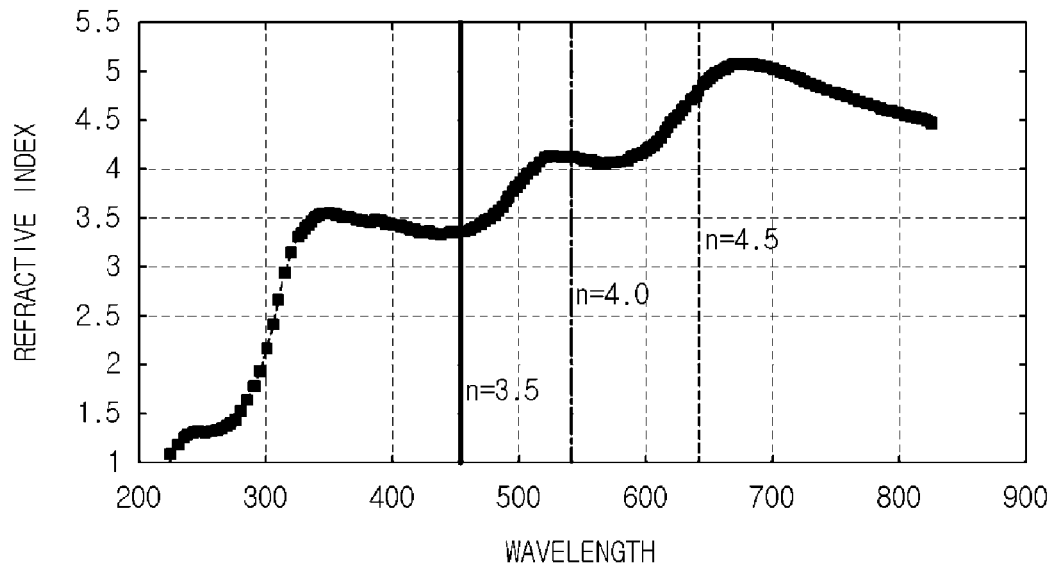
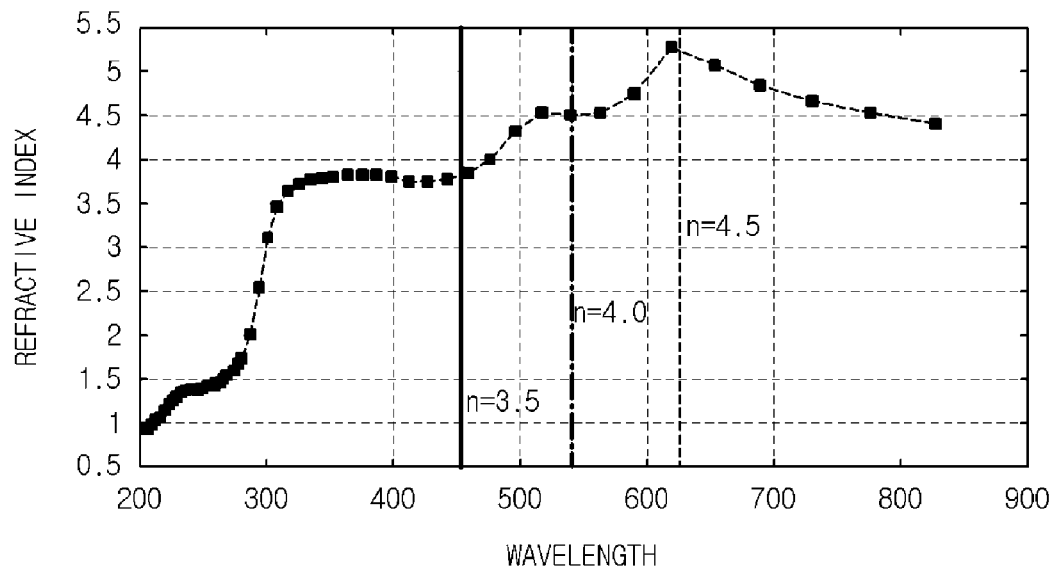

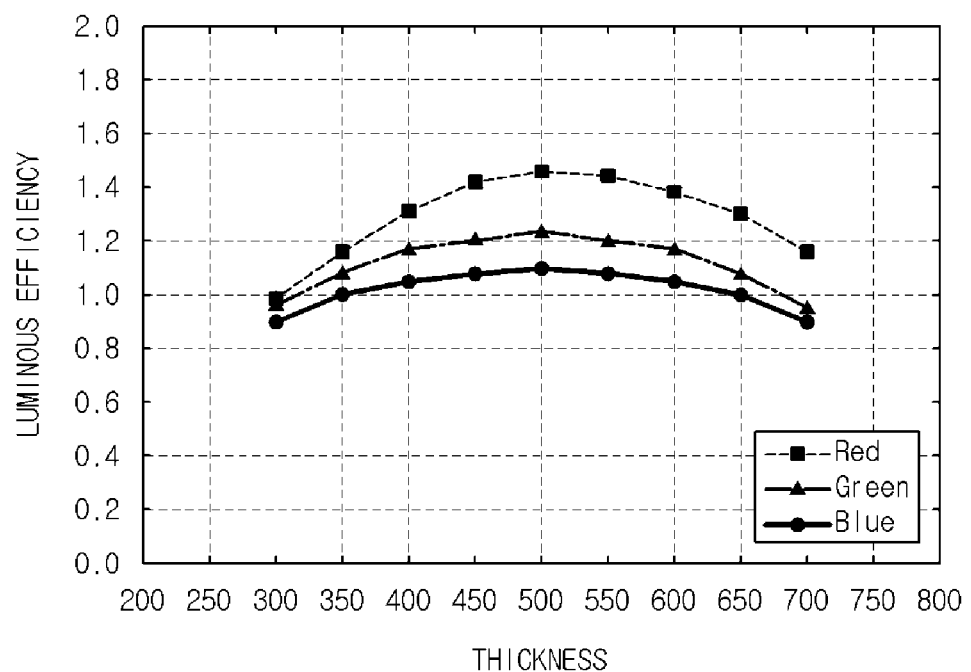

ORGANIC LIGHT EMITTING DISPLAY DEVICE

The present application claims priority under 35 U.S.C. §119(a) of Korean Patent Application No. 10-2013-0165283 filed on Dec. 27, 2013 which is hereby incorporated by reference in its entirety.

BACKGROUND OF THE INVENTION

1. Field of the Disclosure

The present application relates to an organic light emitting display device. More particularly, the present application relates to an organic light emitting display device adapted to form a capping layer in a uniform thickness regardless of kinds of sub-pixels and secure a high luminous efficiency characteristic.

2. Description of the Related Art

Nowadays, a display field for visually representing an electrical information signal has been rapidly developed with the spread of information society. In accordance therewith, a variety of flat panel display devices with features, such as slimness, light weight and low power consumption have been developed. Also, the flat panel display devices have been rapidly replacing the existing cathode ray tubes (CRTs).

As examples of the flat panel display devices, liquid crystal display (LCD) devices, organic light emitting display (OLED) devices, electrophoretic display (electric paper display (EPD)) devices, plasma display panel device (PDPs), field emission display (FED) devices, electroluminescence display devices (ELDs), elector-wetting display (EWD) devices, and so on can be introduced. Such flat panel display devices commonly include a flat display panel, which realizes an image, as a necessary component. The flat display panel is configured with a pair of combined substrates which face each other with having an inherent light emitting or polarizing material layer therebetween.

Among the flat panel display devices, the OLED device includes an organic light emitting element corresponding to a self-luminous element. As such, the OLED device is not necessary for any light source which is used in the LCD device corresponding to a non-luminous device. In accordance therewith, the OLED device can become lighter and thinner. Also, the OLED device has features wider viewing angle, superior contrast ratio, lower power consumption, lower driving DC (direct current) voltage and higher response time compared to the LCD device. Moreover, the OLED device includes soled components. Therefore, the OLED device can well endure external impacts and is driven in a wide temperature range.

The organic light emitting element used in the OLED device includes an anode electrode, a cathode electrode and an organic emission layer which are formed on a substrate. The organic emission layer is interposed between the anode and cathode electrodes. The anode electrode is formed from a transparent conductive material such as indium tin oxide ITO, the cathode electrode is formed from a metal such as aluminum Al, and the organic emission layer is formed from an organic material. Such an OLED device applies an electric field to the organic emission layer in order to emit light.

When a voltage is applied between the anode and cathode electrodes of the organic light emitting element, holes injected from the anode electrode and electrons injected from the cathode electrode are drifted toward the organic emission layer. Also, the holes and the electrons are recombined with each other within the organic emission layer, thereby generating excitons. As such, the OLED device can use light which is emitted by a transition of the excitons from an excited (or triplet) state into a ground state.

An OLED device of the related art can be manufactured in a top-emission mode suitable to emit light in a frontward direction. The top-emission mode OLED device can include: a lower electrode with a reflective film; an organic emission layer; and an upper electrode corresponding to a semi-transparent electrode. In order to raise light efficiency, the top-emission mode OLED device can further include a capping layer which is formed on the upper electrode and used as an optical adjustment (or control) layer. The capping layer adjusts a difference of the refractive index with the exterior (or the atmosphere) and raises the reflectance of its interfacial surface with the exterior (or the atmosphere). This reflectance increment can induce the capping layer to generate a micro-cavity effect for a fixed wavelength band. The capping layer can be formed from an organic material. Alternatively, in order to maximize the micro-cavity effect, the capping layer can be from an inorganic material with high reflectance. The inorganic capping layer can provide features of higher luminous efficiency and lengthier life time compared to the organic capping layer.

FIG. 1 is a data sheet illustrating the luminous efficiency characteristic of the related art OLED device with respect to the thickness of a capping layer.

Referring to FIG. 1, luminous efficiencies of color sub-pixels to the thickness of an inorganic material which is used to form a capping layer of the related art OLED device are illustrated. Light emitted from the organic light emitting element can have one of different wavelengths which are determined according to whether the organic light emitting element is used in anyone of red, green and blue sub-pixels. In accordance therewith, as seen from FIG. 1, it is evident that the optimum thickness of the capping layer which can maximize the luminous efficiency must be different according to the red, green and blue sub-pixels.

However, the related art OLED device forces the capping layer to be formed in the same thickness for every sub-pixel without considering optimum thicknesses in accordance with kinds of sub-pixels. Due to this, it is difficult to secure the maximum luminous efficiency for each of the color sub-pixels. Alternatively, the related art OLED device can allows the thickness of the capping layer to be different according to kinds of sub-pixels. In this case, different chambers must be used in the manufacture procedure of the OLED device. Due to this, productivity for the OLED device must deteriorate.

In other words, it is possible for the related art OLED device to realize only one of the maximum luminous efficiency and high productivity.

BRIEF SUMMARY

Accordingly, embodiments of the present invention are directed to an OLED device that substantially obviates one or more of problems due to the limitations and disadvantages of the related art.

The embodiments are to provide an OLED device which is adapted to enhance productivity and form a capping layer in a uniform thickness regardless of kinds of sub-pixels.

Also, the embodiments are to provide an OLED device which is adapted to form a capping layer in a uniform thickness regardless of kinds of sub-pixels and secure the maximum luminous efficiency for each of the sub-pixels.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In order to solve the above-mentioned problems of the related art, an OLED device according to a general aspect of the present embodiment includes: a substrate defined into a plurality of sub-pixel regions which includes red, green and blue sub-pixel regions; a first electrode formed on the substrate; an organic emission layer formed on the first electrode; a second electrode formed on the organic emission layer; and a capping layer formed on the second electrode, wherein the capping layer is formed to contain an optical adjustment material which rises in proportion to a wavelength of incident light.

An OLED device according to another aspect of the present embodiment includes: a substrate defined into a plurality of sub-pixel regions which includes red, green and blue sub-pixel regions; first electrodes formed on the substrate; organic emission layers formed on the first electrodes; a second electrode formed on the organic emission layers; and a capping layer formed on the second electrode, wherein the capping layer is formed to contain an optical adjustment material with a variable refractive index which varies along a wavelength of incident light.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings:

FIGS. 3A and 3B are data sheets a refractive index characteristic to the wavelength of incident light for an OLED device of the present invention; and FIG. 4 is a data sheet illustrating a luminous efficiency characteristic to the thickness of a capping layer for an OLED device of the present invention.

DETAILED DESCRIPTION OF THE EMBODIMENTS

Figure 1:
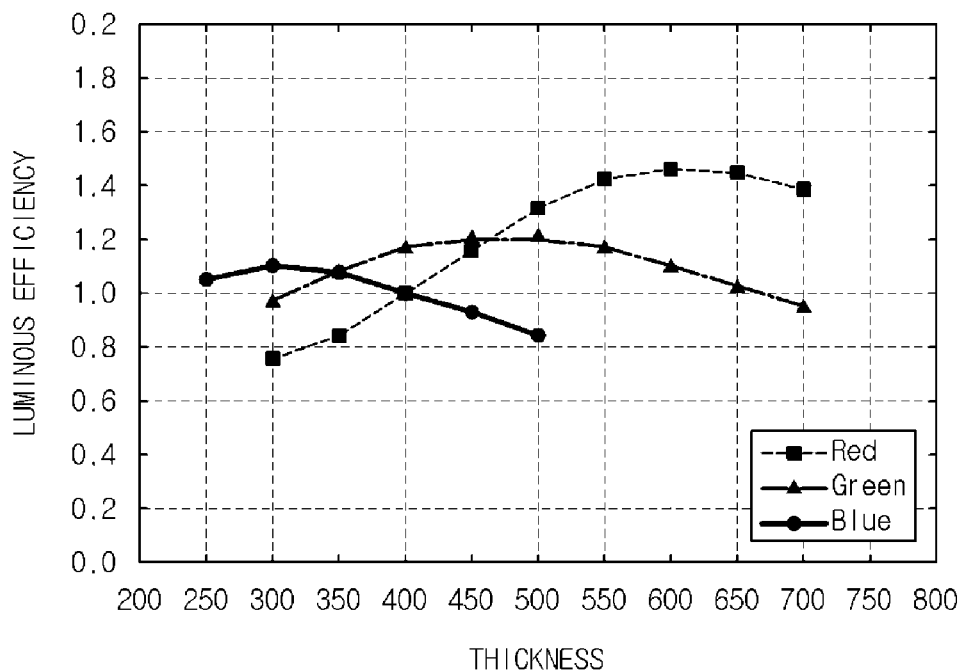
FIG. 1 is a data sheet illustrating a luminous efficiency characteristic to the thickness of a capping layer for an OLED device of the related art.

Reference will now be made in detail to the embodiments of the present invention, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 2:
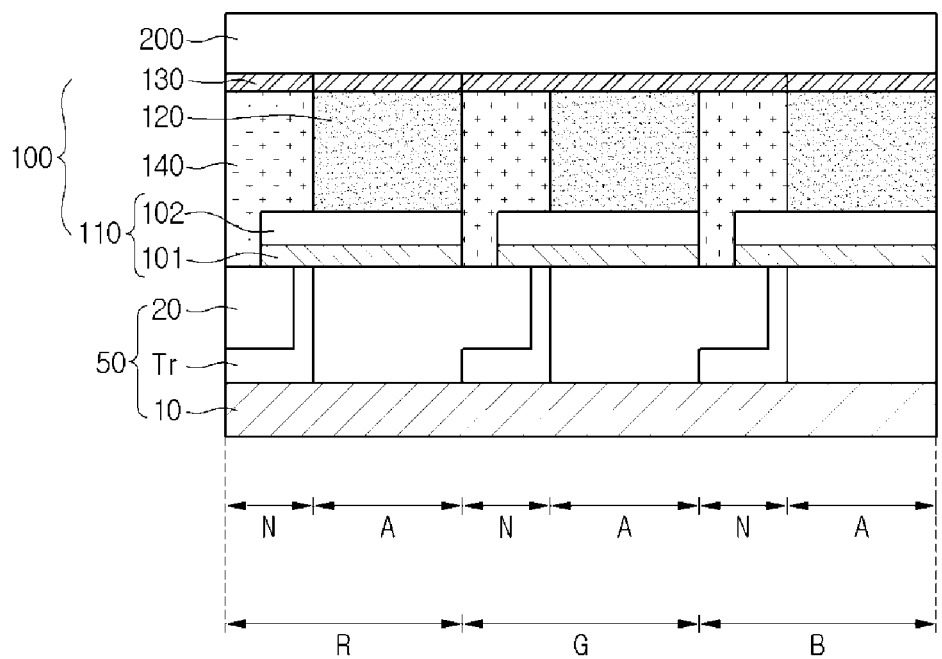
FIG. 2 is a cross-sectional view showing an OLED device according to an embodiment of the present invention.

FIG. 2 is a cross-sectional view showing an OLED device according to an embodiment of the present disclosure.

Referring to FIG. 2, the OLED device according to an embodiment of the present disclosure includes an element substrate 50 defined into a plurality of sub-pixel regions, and organic light emitting elements 100 formed on the element substrate 50. The plurality of sub-pixel regions includes red, green and blue sub-pixel regions R, G and B. Each of the red, green and blue sub-pixel regions R, G and B can be defined into an emission region A and a non-emission region N. Also, the OLED device includes a capping layer 200 formed on the organic light emitting elements 100.

The organic light emitting element 100 includes a first electrode 110, an organic emission layer 120 and a second electrode 130. The emission region A and the non-emission region N can be defined by a bank pattern 140. The bank pattern 140 is formed in an overlapping shape with a part of the first electrode 110 and exposes the first electrode 110 to only the emission region A.

The first electrode 110 can be used as an anode electrode. Such a first electrode can be configured with a reflective layer 101 and an electrode layer 102 stacked on the reflective layer 110. The reflective layer 101 can be formed from a metal material with a high reflectance. For example, the reflective layer 101 can be formed from aluminum Al. The electrode layer 102 can be from a transparent conductive material such as indium tin oxide ITO. However, the reflective layer 101 and the electrode layer 102 are not limited to these.

The organic emission layer 120 is formed on the exposed surface of the first electrode 110 through the bank pattern 140. The organic emission layer 120 can be configured with a single layer formed from an emission material. Alternatively, in order to increase the luminous efficiency, the organic emission layer can be formed in a multi-layered structure which includes a hole injection layer, a hole transport layer, an emission material layer, an electron transport layer and an electron injection layer. It is shown in the drawing that the organic emission layer 120 is formed to have the same thickness in the red, green and blue sub-pixel regions R, G and B. However, the organic emission layer 120 can be formed in optimum thicknesses in accordance with kinds of sub-pixels, in order to provide a micro-cavity effect. In other words, the organic emission layer 120 can be formed to different thickness in the red, green and blue sub-pixel regions R, G and B.

The second electrode 130 is formed on the organic emission layer 130. If the first electrode 110 is used as the anode electrode, the second electrode 130 can become a cathode electrode. Such a second electrode 130 can be formed from a semi-transparent electrode material so that light is emitted in an upward (or frontward) direction.

The element substrate 50 includes an insulation substrate 10 formed from an insulation material, and thin film transistors Tr formed on the insulation substrate 10. The insulation material includes glass, a plastic material and so on. The thin film transistors Tr are used to drive the respective sub-pixels. The thin film transistor Tr includes: a gate electrode formed on the insulation substrate 10; a gate insulation film configured to cover the gate electrode; a semiconductor layer formed on the gate insulation film opposite to the gate electrode and configured to form a channel; and source and drain electrodes arranged to face each other with having the channel therebetween. A planarization film 20 is formed on the insulation substrate 10 provided with the thin film transistors Tr. The drain electrodes of the thin film transistors Tr formed on the element substrate 50 are electrically connected to the respective first elements 110 of the organic light emitting elements 100.

A capping layer 200 is formed on the organic light emitting elements 100. The capping layer 200 is disposed on the second electrode 130 of each organic light emitting element 100 and used as an optical adjustment (or control) layer. Such a capping layer 200 adjusts a difference of the refractive index with the exterior (or the atmosphere) and raises the reflectance of its interfacial surface with the exterior (or the atmosphere). The reflectance increment enables the capping layer 200 to generate a micro-cavity effect for a fixed wavelength band of light.

On the other hand, the related art OLED device including the capping layer formed in the same thickness for every sub-pixel cannot secure the maximum luminous efficiency. Alternatively, the related art OLED device forms the capping layer in different thicknesses according to kinds of sub-pixels. In this case, different chambers must be used in the manufacture procedure of the OLED device. Due to this, productivity for the OLED device must deteriorate.

However, the OLED device according to the present disclosure allows the capping layer 200 to include an optical adjustment material with a refractive index characteristic which rises according to the wavelength of light. As such, although the capping layer 200 is formed in a uniform thickness regardless of kinds of sub-pixels, every sub-pixel can have the maximum luminous efficiency. This will now be described in detail.

FIGS. 3A and 3B are data sheets a refractive index characteristic to the wavelength of incident light for an OLED device of the present disclosure.

The capping layer 200 can be formed from one of an organic material and an inorganic material. Also, the capping layer 200 can be formed to contain an optical adjustment material with a variable refractive index which rises according to the wavelength of light as shown in FIGS. 3A and 3B. As such, the optical adjustment material of the capping layer 200 within the red sub-pixel region R can have a higher refractive index than at least 0.1 compared to that of the optical adjustment material of the capping layer 200 within the green sub-pixel region G. Also, the optical adjustment material of the capping layer 200 within the green sub-pixel region G can have a larger refractive index than 0.1 compared to that of the optical adjustment material of the capping layer 200 within the blue sub-pixel region B. This results from the fact that the wavelength of light emitted from the sub-pixel is enlarged in the order of blue, green and red sub-pixels. In other words, the refractive index differences result from the fact that a red light wave has the longest wavelength, a green light wave has a middle wavelength, and a blue light wave has the shortest wavelength.

Such an optical adjustment material of the capping layer 200 can contains at least one selected from a material group which includes GsSb, InGaSb and InSb. FIG. 3A illustrates a refractive index characteristic to the wavelength of light for the capping layer 200 formed to contain InGaSb. FIG. 3B illustrates a refractive index characteristic to the wavelength of light for the capping layer 200 formed to include GaSb.

The micro-cavity effect can be generated on the basis of the wavelength of light and the refractive index and thickness of the capping layer 200 which corresponds to an optical adjustment layer.

$$2 \times n \times d = m \times \lambda \qquad \text{[Equation 1]}$$

In the equation 1, the 'n' is a refractive index, the 'd' is a thickness, the 'm' is a constant (or an invariable number), and the 'λ' is a wavelength value.

Actually, in order to generate the micro-cavity effect, the related art OLED device adjusts only the thickness of the capping layer on the basis of the refractive indexes opposite to wavelengths of light without considering the refractive index of the capping layer 200. Also, materials forming the capping layer 200 of the related art OLED device must decrease in proportion to the wavelength of incident light. Due to this, the related art OLED device cannot form the capping layer 200 in the same thickness for every sub-pixel.

However, the capping layer 200 included in the OLED device of the present disclosure is formed to contain an optical adjustment material with a variable refractive index which rises in proportion to the wavelength of light. As such, the capping layer 200 can be formed in a uniform thickness for every sub-pixel.

The capping layer 200 can be formed from only an optical adjustment material. As such, the capping layer 200 can contain one of organic and inorganic compounds, which have a different refractive index from that of the optical adjustment material, with the exception of the optical adjustment material. The organic or inorganic compound can have a lower refractive index compared to the optical adjustment material. In detail, the refractive index of the organic or inorganic compound can be in a range of about 1.0~2.0. For example, the inorganic compound can be one selected from a material group which includes LiF, MgF2 and so on, and the organic compound can be one selected from a material group which includes Alq3, NPB, TPD and so on. However, the capping layer 200 is not limited to the above-mentioned materials. In other words, every material suitable to provide a desired refractive index can be used in the formation of the capping layer 200.

If the capping layer 200 is formed from an optical adjustment material, which has a high refractive index, such as GaSb, InGaSb and InSb, the capping layer 200 can be formed to have a higher refractive index compared to a desired refractive index. In this case, an organic or inorganic compound with a low refractive index can further be contained into the capping layer 200. In other words, the capping layer 200 with the desired refractive index can be formed by simultaneously depositing a high refractive index material and a low refractive index material through adjustment of a deposition ratio therebetween and deposition speeds thereof.

FIG. 4 is a data sheet illustrating a luminous efficiency characteristic to the thickness of a capping layer for an OLED device of the present disclosure.

As seen from FIG. 4, it is evident that the capping layer 200 included in the present disclosure allows the red, green and blue sub-pixels to have similar luminous efficiency characteristics with respect to thickness. As such, a part of the capping layer of the red sub-pixel region R suitable to maximize the luminous efficiency of the red pixel R, another part of the capping layer of the green sub-pixel region G suitable to maximize the luminous efficiency of the green pixel G, and still another part of the capping layer of the blue sub-pixel region B suitable to maximize the luminous efficiency of the blue sub-pixel can have the same thickness.

In other words, the portions of the capping layer opposite to the red, green and blue sub-pixel regions R, G and B can be formed in the same thickness, in order to optimize the red, green and blue sub-pixels R, G and B. In comparison with the related art OLED device which forces the optimum thickness of the capping layer to be different in the red, green and blue sub-pixel regions due to different luminous efficiency characteristics of the red, green and blue sub-pixels to the thickness of the capping layer shown in FIG. 1, the OLED device of the present disclosure can be remarkably distinguished.

The following table 1 illustrates experiment resultants for the capping layers of the related art ("Comparative embodiment") and the present invention ("Present embodiment"). The capping layers of the Comparative and Present embodiments are formed to have the same thickness of about 500 Å.

TABLE 1

|  | Refractive index | | | Current-luminous efficiency (cd/A) | | |
| --- | --- | --- | --- | --- | --- | --- |
|  | R (630 nm) | G (530 nm) | B (460 nm) | R (630 nm) | G (530 nm) | B (460 nm) |
| Comparative embodiment | 2.6 | 2.7 | 2.9 | 48 | 90 | 5.0 |
| Present embodiment | 3.1 | 2.65 | 2.3 | 65 | 105 | 5.5 |

The capping layer of the present invention is formed to contain a material with a variable refractive index which rises (or varies) along the wavelength of incident light, unlike that of the related art. As such, it is evident that the optical characteristic of the OLED device according to the present invention is largely enhanced.

As described above, the OLED device of the present invention allows the capping layer to be formed in the same thickness regardless of kinds of color sub-pixels. In accordance therewith, productivity of the OLED device can be enhanced. Also, maximum luminous efficiencies for the color sub-pixels can be secured.

Although embodiments of the present invention have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode device comprising:
a substrate defined into a plurality of sub-pixel regions which include red, green and blue sub-pixel regions;
a first electrode formed on the substrate;
an organic emission layer formed on the first electrode;
a second electrode formed on the organic emission layer; and
a capping layer formed on the second electrode,
wherein the capping layer is formed to contain an optical adjustment material with a refractive index which rises in proportion to a wavelength of incident light, and
wherein the optical adjustment material is one selected from a material group which includes GaSb, InGaSb and InSb.

2. The organic light emitting diode device of claim 1, wherein
the capping layer within the red sub-pixel region is formed to have a refractive index at least 0.1 higher than a refractive index within the green sub-pixel region, and the capping layer within the green sub-pixel region is formed to have a refractive index at least 0.1 higher than a refractive index within the blue sub-pixel region.

3. The organic light emitting diode device of claim 1, wherein a part of the capping layer suitable to maximize a luminous efficiency of the red sub-pixel region, another part of the capping layer suitable to maximize another luminous efficiency of the green sub-pixel region, and still part of the capping layer suitable to maximize still another luminous efficiency of the blue sub-pixel region are formed to have a same thickness.

4. The organic light emitting diode device of claim 1, wherein the capping layer is formed to further include one of organic and inorganic compounds, the inorganic compound is one selected from a material group which includes LiF, MgF2, the organic compound is one selected from a material group which includes Alq3, MPB Alq3, NPB, TPD.

5. The organic light emitting diode device of claim 4, wherein the organic or inorganic compound has a refractive index range of about 1~2, the organic or inorganic compound having a lower refractive index compared to the optical adjustment material.

6. The organic light emitting diode device of claim 1, wherein the capping layer is formed to have a thickness of about 500 Å.

7. An organic light emitting diode device comprising:
a substrate defined into a plurality of sub-pixel regions which include red, green and blue sub-pixel regions;
first electrodes formed on the substrate;
organic emission layers formed on the first electrodes;
a second electrode formed on the organic emission layers; and
a capping layer formed on the second electrode,
wherein the capping layer is formed to contain an optical adjustment material with a variable refractive index which varies along a wavelength of incident light and a compound,
wherein a refractive index of the optical adjustment material is higher than a refractive index of the compound and the variable refractive index of the capping layer is determined based on a deposition ratio or deposition speeds of the optical adjustment material and the compound, and
wherein the optical adjustment material is one selected from a material group which includes GaSb, InGaSb and InSb.

8. The organic light emitting diode device of claim 7, wherein the capping layer is formed to have a uniform thickness in all the red, green and blue sub-pixel regions.

9. The organic light emitting diode device of claim 8, wherein the capping layer has a smaller refractive index in the red sub-pixel region, a middle refractive index in the green sub-pixel region, and a largest refractive index in the blue sub-pixel region.

10. The organic light emitting diode device of claim 8, wherein
the capping layer within the red sub-pixel region is formed to have a refractive index at least 0.1 higher than a refractive index within the green sub-pixel region, and
the capping layer within the green sub-pixel region is formed to have a refractive index at least 0.1 higher than a refractive index within the blue sub-pixel region.

11. The organic light emitting diode device of claim 8, wherein the compound is an organic or inorganic compound having a refractive index range of about 1~2.

12. The organic light emitting diode device of claim 8, wherein the capping layer is formed to have a thickness of about 500 Å.

13. The organic light emitting diode device of claim 8, wherein the inorganic compound is one selected from a material group which includes LiF, MgF2.

14. The organic light emitting diode device of claim 8, wherein the organic compound is one selected from a material group which includes Alq3, NPB, TPD.

* * * * *